United States Patent [19]
Denes et al.

[11] 4,163,967
[45] * Aug. 7, 1979

[54] REVERSIBLE CODE COMPRESSOR

[75] Inventors: Jozsef Denes; Mihaly Szokolay, both of Budapest, Hungary

[73] Assignee: Szamitastechnikai Koordinacios Intezet, Budapest, Hungary

[*] Notice: The portion of the term of this patent subsequent to Jun. 14, 1994, has been disclaimed.

[21] Appl. No.: 759,377

[22] Filed: Jan. 14, 1977

Related U.S. Application Data

[63] Continuation of Ser. No. 468,548, May 9, 1974, Pat. No. 4,030,093, which is a continuation-in-part of Ser. No. 281,016, Aug. 16, 1972, abandoned.

[51] Int. Cl.$^2$ ............................................. H03K 13/00
[52] U.S. Cl. ............................................. 340/347 DD
[58] Field of Search .................. 340/347 DD; 178/66, 178/67, 68

[56] References Cited

U.S. PATENT DOCUMENTS

| | | | |
|---|---|---|---|
| 3,562,742 | 2/1971 | Abe | 340/347 DD |
| 4,030,093 | 6/1977 | Denes | 340/347 DD |

*Primary Examiner*—Charles D. Miller
*Attorney, Agent, or Firm*—Haseltine, Lake & Waters

[57] ABSTRACT

A system for the condensation of a binary signal sequence and for the reproduction of the condensed signal sequence, in which the same encoding means is used both for the condensation and for the reproduction. In the reproduction mode of operation inverters are connected in series with the input and the output of the encoding means. The two inverters together with the encoding means act as a decoder because such a transformation function is selected for the encoding means at which the inverse transformation function is just the complementary function thereof.

2 Claims, 4 Drawing Figures

REVERSIBLE CODE COMPRESSOR

CROSS-RELATED REFERENCES

The present application is a continuation of the parent application Ser. No. 468,548, filed May 9, 1974 now U.S. Pat. No. 4,030,093 which is a continuation-in-part of Ser. No. 281,016 filed Aug. 16, 1972 now abandoned.

BACKGROUND OF THE INVENTION

In computer technology, data transmission and control technology, the representation of information in the binary system of numbers has gained wide acceptance. Numbers in the binary system are expressed by two digits only, viz. 0 (zero) and 1 (unity). The use of the binary system is a convenient expedient, because simple bistable systems may be used for the physical representation of data.

Binary representation of information (e.g. data, letters, symbols, etc.) produces sequences consisting only of zeroes and ones. Let this sequence be called an elementary signal sequence or more briefly, a signal sequence.

Among these signal sequences, in the majority of cases the zeroes and ones, i.e. the elementary signals, follow one another in a random order. However, in some actual sequences the elementary signals do not occur at a uniform frequency. Often there are considerable differences in the frequencies of occurrence of the elementary signals. In other sequences, it can be shown that differences will appear in the probability of occurrence of certain shorter or longer sequences of the elementary signals, sequences which may be called letter or blocks, i.e., frequency of the blocks rather than of the elementary signals.

In the course of research in the theory of encoding several procedures have been developed, by means of which the length of elementary signal sequences of information may be reduced, provided that the frequencies of occurrence of elementary signals or of sequences differ from one another. In this manner, for example, the length of a signal sequence of information may successfully be shortened or shrunk by means of codes of varying word lengths.

For the explanation of the use of such codes of variable word lengths let us write down the following elementary signal sequence: . . . 000000000110001000000000000 . . .

Of the 27 elementary signals of the sequence, 24 are zeroes and 3 are ones. Let us form a new elementary signal sequence in conformity with the following rule: Starting at the beginning of the sequence, for each pair of zeroes substitute a single zero, for each one a pair comprising a one and a zero, and for a pair comprising a zero and a one, a pair comprising two ones in order to form a new sequence, i.e. the following rule is applied:

$$00 \to 0$$
$$1 \to 10 \quad (a)$$
$$01 \to 11$$

Bloch was the first to publish this rule of code transformation. On completing the operation, the sequence . . . 000011100110000000 . . . is obtained.

This sequence is about 63 percent. shorter than the original sequence. When the same process is now applied to the new sequence, this will boil down to . . . 0010101001010000 . . . and, if repeated, to . . . 01011110101100 . . .

Hence the sequence originally consisting of 27 signals can be reduced to a sequence of only 14 signals. However, at this point it is no longer worthwhile to continue the procedure, since with an additional step a binary number of 17 digits would be obtained, viz.: . . . 11111010101111100 . . .

The reduction of the length of information signal sequences is a useful procedure, as considerable savings can result from both the transmission and storage of the shorter signal sequences. As a matter of fact, shorter sequences result in information being transmitted at a higher speed. For a given storage capacity, the devices may store more information.

By resorting to an inverse transformation, the shrunk or reduced signal sequences can be decoded to recover the original sequences. For this operation the following transformations are applied:

$$11 \to 01$$
$$10 \to 1 \quad (b)$$
$$0 \to 00$$

For the shrinkage and restoration, an encoder and a decoder are required the function of which is to transform the signal sequences in conformity with rules (a) and (b). If these operations are to be repeated, as in the example above, provision will have to be made for several encoders and decoders, as well as for intermediate matching units.

The encoders $K_1 \ldots K_N$, in the arrangement in FIG. 1 and the decoders, $D_1, D_2, \ldots D_N$ in FIG. 2 carry out the instructions (a) and (b) respectively. However, there is considerable difference in the operating speeds of the various circuits. In FIG. 1 the input of the first encoder $K_1$ has been given the symbol $x_o$, while its output is designated $x_1$. If a signal sequence of a constant frequency $f_o$ is applied to the input $x_o$, then at the output $x_1$ the average value of the frequency, $f_1$, may fluctuate between 0.5 $f_o$ and 2 $f_o$ according to the ratio of zeroes to ones in the input signals. Consequently a signal of fluctuating frequency passes to the input of the encoder $K_2$, so that the frequency of the signal appearing at point $x_2$ can change or can even be greater compared to that at $x_1$. The situation is very much the same with the signal frequencies of the inputs $y_o, y_1, \ldots y_N$ in FIG. 2. For the control of the encoding and decoding procedures control circuits $V_K$ and $V_D$ are required, which are, respectively, connected to the circuits $K_i$ and $D_i$ i=1, 2, . . . N. In general the individual encoders and decoders, and therefore the control circuits $V_K$ and $V_D$, differ from one another. However, the use of a variety of types equipment is fraught with disadvantages.

BRIEF SUMMARY OF THE INVENTION

According to the invention, the encoding and decoding operations are simplified to a degree that both operations can be performed by identical circuits. Similarly the circuitry according to the invention also simplifies control.

Instead of rule (a) well known from the literature, let us now use the following rule for encoding:

$$00 \to 0$$

-continued

| |  |
|---|---|
| 1 → 11 | (c) |
| 01 → 10 | |

The corresponding rule for decoding (c) reads as follows:

| | |
|---|---|
| 11 → 1 | |
| 0 → 00 | (d) |
| 10 → 01 | |

Obviously the conversion chart (d) may be derived from the chart (c) (and vice versa) by simply complementing each elementary signal, i.e. by performing the transformations 0→1 and 1→0.

Let X denote the elementary signal sequence to be reduced, and Y the signal sequence after reduction. The complementary sequences of these signal sequences are designated, respectively $\overline{X}$ and $\overline{Y}$. The transformation according to (c) can be written as follows:

$$Y = f(x) \quad (e1)$$

The symbol f designates the transformation given in (c). Let the symbol $f^{-1}$ designate the inverse transformation given in (d). This way the original sequence X can be decoded from the encoded sequence Y according to the expression $$x = f^{-1}(Y) \quad (e2)$$

Since the transformation charts (c) and (d) are in complementary relationship with each other, the form (e2) can be expressed as:

$$\overline{x} = f(\overline{Y}), \text{ and after inversion} \quad (f1)$$

$$2 = \overline{f(\overline{Y})} \quad (f2)$$

Therefore the original sequence Y can be recovered from the encoded sequence Y by complementing the sequence Y, encoding this complemented sequence and complementing the result.

Complementation can be technically realized in a simple manner, i.e. by using an inverter. By applying the complementary reduction rule according to (c) and (d), realization may be effected with a substantial simplification of the circuitry because the need for a separate decoding system is eliminated.

DESCRIPTION OF THE PREFERRED EMBODIMENT

Figure 1:
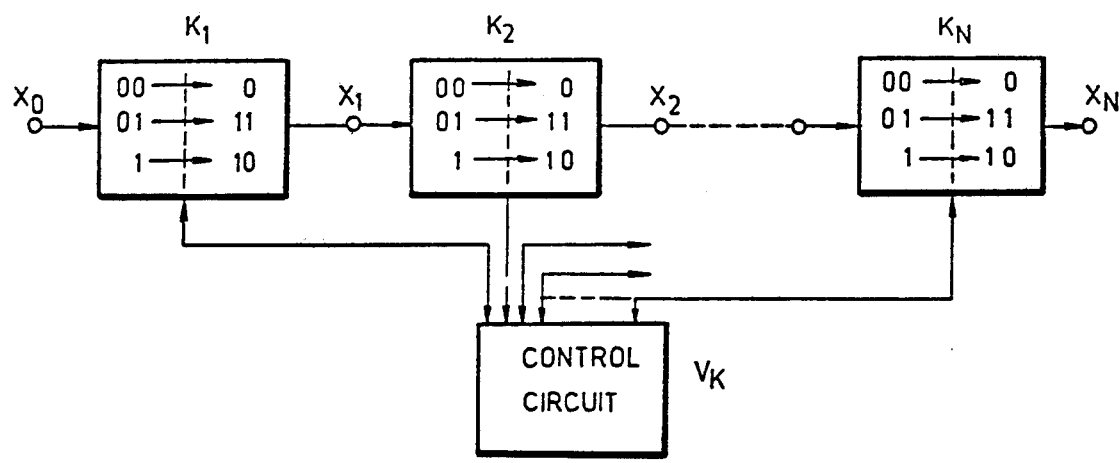
FIG. 1 shows a schematic block diagram for a prior art encoding system.
Figure 2:
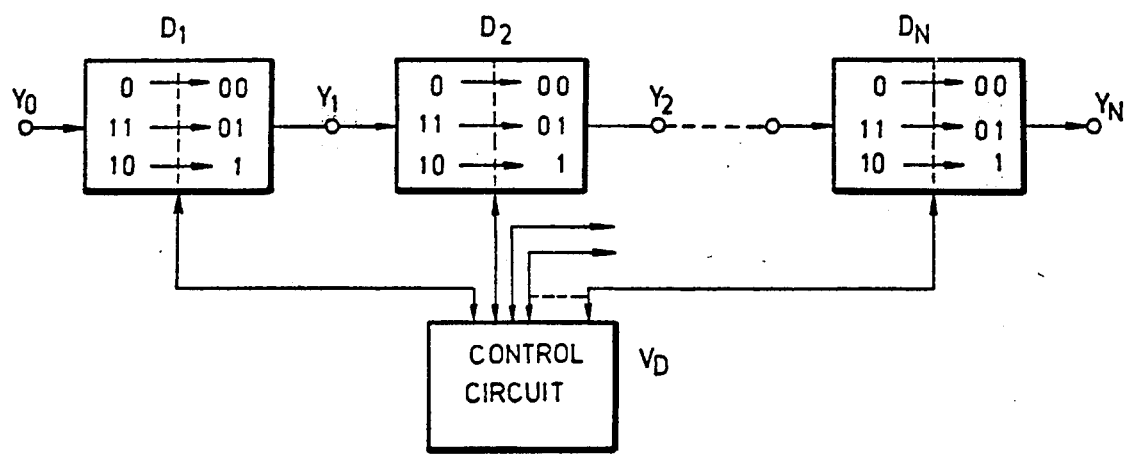
FIG. 2 shows a schematic block diagram for a prior art decoding system.
Figure 3:
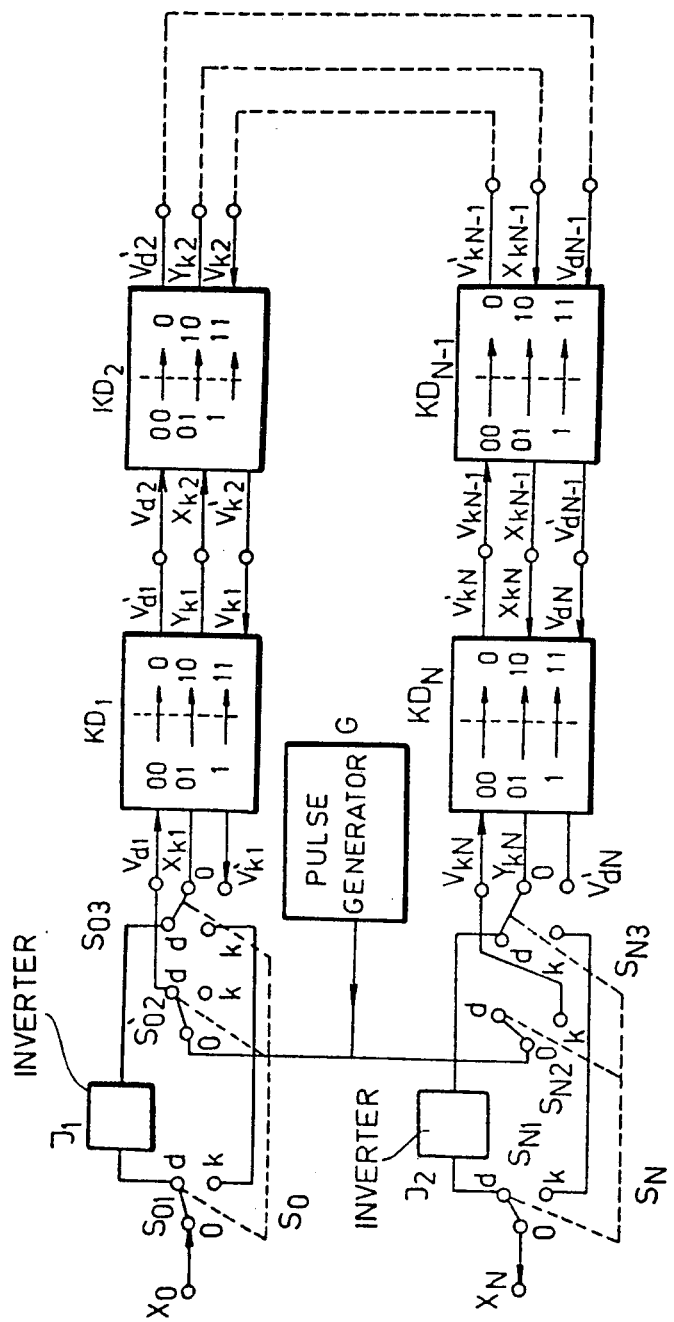
FIG. 3 shows the block diagram of the system according to the present invention wherein the encoding and the decoding are carried off by the same encoding stages.

The circuitry according to the invention is shown in FIG. 3. The circuit comprises code transformers $KD_1$, $KD_2$, ... $KD_N$, inverters $I_1$, $I_2$, changeover switches $S_o$–$S_n$ and a pulse generator G.

In conformity with rule (c) the code transformers $KD_1$, $KD_2$, ... $KD_N$ for encoding by the transformations

| |
|---|
| 00 → 0 |
| 1 → 11 |
| 01 → 10; | and, in conformity with rule (d), for decoding, in conjunction with the inverters $I_1$, $I_2$, by the transformation

| |
|---|
| 11 → 1 |
| 0 → 00 |
| 10 → 01 | in conformity with rule (e), combine to set up the encoding equation $Y=f(X)$ and, in conformity with rule (f), the equation $\overline{X}=f(\overline{Y})$. The signals are applied to the code transformers through inputs $x_{k1}, x_{k2}, \ldots x_{kN}$. The transformed signals then appear at the outputs $y_{k1}, y_{k2}, \ldots y_{kN}$.

For encoding, the code transformers are controlled by inputs $v_{d1}, v_{d2}, \ldots v_{dN}$, for decoding by outputs $v_{k1}, v_{k2}, \ldots v_{kN}$. For controlling the adjacent code transformers, the code transformers issue controlling signals, respectively, on the outputs $v_{d1}', v_{d2}' \ldots v_{dN}'$ and $v_{k1}', \ldots v_{kN}'$. All units $KD_i$ are of uniform design.

For decoding, the inverters $I_1$ and $I_2$ perform the required complementation of the input and output signal sequences.

For encoding, a pulse generator G is connected to the input $v_{kN}$ of the code transformer $KD_N$. For decoding, it is connected to the input $v_{d1}$ of the code transformer $KD_1$.

Encoding or decoding may be selected by means of the two-position switches $S_o$ and $S_N$. Switches $S_o$ and $S_N$ comprise respectively, the change-over switches $S_{o1}$, $S_{o3}$ and $S_{N1}$, $S_{N3}$. Throwing the switches $S_o$–$S_N$ operates all the change-over switches at the same time. The signals are passed through the change-over switches $S_{o1}$, $S_{o3}$, $S_{N1}$, $S_{N3}$.

For encoding, the points 0 of the change-over switches are connected to the points k. For decoding, they are connected to the points d. The circuit shown in FIG. 3 is in "decoding" position.

Figure 4:
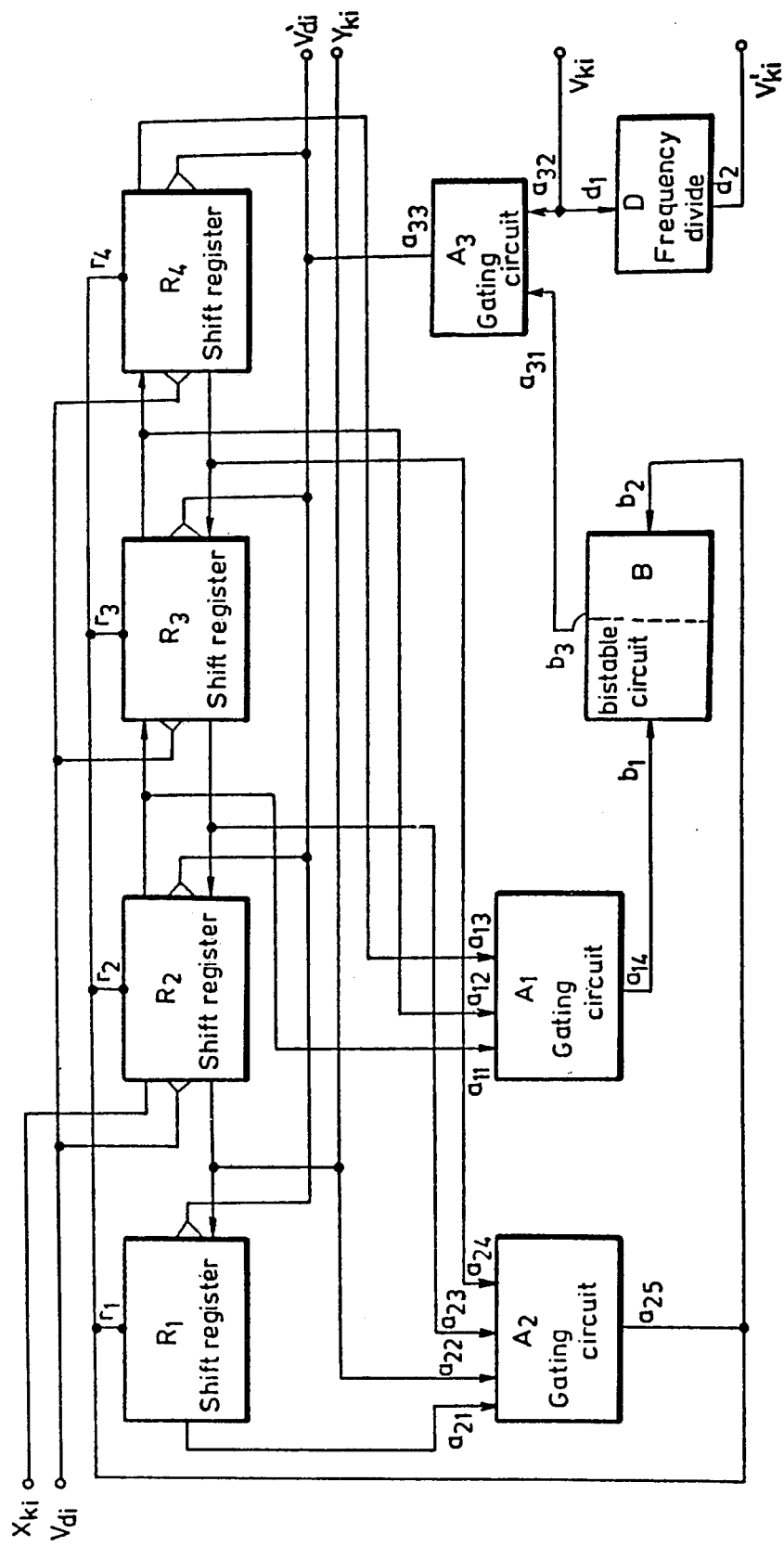
FIG. 4 shows the block diagram of an embodiment of a decoding stage shown in FIG. 1.

A possible realization of the code transformers $KD_1$ to $KD_N$ of identical construction is illustrated in FIG. 4. The circuit of FIG. 4 comprises shift registers $R_1$ to $R_4$, gating circuits $A_1$ to $A_3$, a bistable circuit B, and a frequency divider D.

Shift registers $R_1$ to $R_4$ are operable for shifting in both directions, i.e. to the right and to the left respectively. A shifting to the right occurs by means of a shifting signal synchronized with signals to be coded and led to the input $V_{di}$. The frequency of the signal shifting to the left is such that the circuit is capable of accomplishing two shiftings to the left between two shiftings to the right. The circuit receives the control frequency, from which the signal for shifting to the left is produced, on the input $V_{Ki}$. Frequency divider D halves said frequency and delivers it to the preceding code transformer stage KD through the output $V'_{Ki}$.

At the beginning of the encoding, the normal position of the registers $R_1$ to $R_4$ is such that the information stored in the stages $R_1$ to $R_4$ is 1100, i.e. the conditions of the register stages are as follows $R_1=1$; $R_2=1$; $R_3=0$; $R_4=0$.

The operation of the circuit will be examined in the following three cases as the information signals 1, 01 and 00, respectively, arrive at the input $X_{Ki}$.

These signals are applied to the input of the stage $R_2$ of the shift register and are shifted in the register to the right. Stage $R_1$ is not involved in the shifting to the right, and therefore its contents do not change during the shifting.

After introduction of an information signal 1, the contents of the registers $R_1$ to $R_4$ are 1110. In that case the gating circuit $A_1$ receives at its inputs the signals $a_{11}=1$, $a_{12}=1$, $a_{13}=0$ from the corresponding outputs of the stages $R_2$, $R_3$ and $R_4$. (Gating circuits $A_1$, $A_2$ and $A_3$ consists of circuits for the realization of logic operations AND and OR). As a result, a signal appears at the output $a_{14}$, which is applied to the input $b_1$ of the bistable circuit B to operate the circuit. Output $b_3$ gives an opening signal to the input $a_{31}$ of the gate $A_3$. In that case gate $A_3$ provides the shifting signal to the left, present at $a_{32}$, to the output $a_{33}$. Due to this shifting signal the registers $R_1$ to $R_4$ shift to the left and the signals shifted to the left pass from stage $R_2$ to the output $Y_{Ki}$. After two shifts to the left, the information 11 present in stages $R_2$ and $R_3$ appears at the output, $Y_{Ki}$ accordingly the code transformation occurs.

After two steps to the left, the contents of the registers $R_1$ to $R_4$ are 1000, if at every shifting to the left a signal 0 is fed in. The construction of the gating circuit $A_2$ is such that on the output $a_{25}$ a signal appears, if on the inputs $a_{22}$, $a_{23}$, $a_{24}$ signals 000 are present, independently of the signal present on the input $a_{21}$. In this case circuit B is brought to its normal condition as a result of the signal present on the input $b_2$, and the gating circuit $A_3$ closes against further shifting. At the same time, the reset terminals $r_1$ to $r_4$ of the registers $R_1$ to $R_4$ receive signal from the output $a_{25}$, so that the registers are brought to their prior normal positions.

If input $X_{Ki}$ receives a signal 01, the contents of registers $R_1$ to $R_4$ will be 1101. Gating circuit $A_1$ produces also a signal at its output $a_{14}$, if the inputs $a_{11}$, $a_{12}$ and $a_{13}$ receive a signal 101. Said shifting to the left is repeated and during two steps a signal 10 appears on the output $Y_{Ki}$, i.e. the encoding occurs. After two steps, the contents of registers $R_1$ to $R_4$ will be 0100. Gating circuit $A_2$ is of the construction so that if at the input $a_{21}$ a signal 0 is present, output $a_{25}$ receives a signal independently of the signals present at inputs $a_{22}$ to $a_{24}$. In this case resetting of the bistable circuit B and of the registers $R_1$ to $R_4$ occurs again.

If input $X_{Ki}$ receives signal 00, the content of registers $R_1$ to $R_4$ will be 1001. As a result of a signal 001 applied to the inputs $a_{11}$, $a_{12}$, $a_{13}$ of the gating circuits $A_1$, a signal appears again on the output $a_{14}$.

Shifting to the left occurs again, therefore, a signal 0 appears on the output, and hence the encoding occurs. After the first step to the left the contents of $R_1$ to $R_4$ will be 0010 and therefore the signal 0 at the input $a_{21}$ of the gating circuit $A_1$ resets the circuit to its normal state, thus in this case only one step to the left is possible.

What we claim is:

1. A system for the condensation of a binary signal sequence and for the reproduction of the condensed signal sequence comprising, in combination an input terminal for applying thereto the uncondensed signal sequence; an output terminal for applying thereto the condensed signal sequence; an input switch connected to said input terminal; an output switch connected to said output terminal; encoder means having an input connected to said input switch, said input switch being connected between said input terminal and the input of said encoder means, said encoder means having an output connected to said output switch, said output switch being connected between said output terminal and the output of said encoder means, said input and output switches connecting said encoder means to said input and output terminals when in a mode of operation for condensing said sequence; a first inverter connected between the input of said encoder means and said input terminal when in a mode of operation for reproducing the original signal sequence prior to condensing; and a second inverter connected between the output of said encoder means and said output terminal in said mode of operation for reproducing the original signal sequence prior to condensing; said input and output switches being operable in the condensing mode of operation to connect said encoder means directly between said input and output terminals, said switches connecting said encoder means in series with said first and second inverters and said output and input terminals, respectively, when in the reproduction mode of operation, said encoder means together with said inverters reproducing the original signal sequence at said input terminal from the encoded condensed signal sequence applied to said output terminal; said encoder means comprising a plurality of encoder stages connected in series, said stages performing the same transformation function; each of said encoder stages comprising shift registers shiftable both to the right and to the left and connected in series; a control circuit producing first shifting pulses for each of said shift registers synchronous with signal pulses applied to the input of the corresponding encoder stage and producing second shifting pulses between each subsequent one of said first shifting pulses for shifting said shift registers a predetermined number of times in opposite direction to that corresponding to said first shifting pulses; said control circuit comprising gating circuits checking the logical state of each of said shift registers at every shifting step and stopping said second shifting pulses at predetermined logical conditions of said shift registers.

2. A system for the condensation of a binary signal sequence and or the reproduction of the condensed signal sequence comprising, in combination an input terminal for applying thereto the uncondensed signal sequence; an output terminal for applying thereto the condensed signal sequence; an input switch connected to said input terminal; an output switch connected to said output terminal; encoder means havin an input connected to said input switch, said input switch being connected between said input terminal and the input of said encoder means, said encoder means having an output connected to said output switch, said output switch being connected between said output terminal and the output of said encoder means, said input and output switches connecting said encoder means to said input and output terminals when in a mode of operation for condensing said sequence; a first inverter connected between the input of said encoder means and said input terminal when in a mode of operation for reproducing the original signal sequence prior to condensing; and a second inverter connected between the output of said encoder means and said output terminal in said mode of operation for reproducing the original signal sequence prior to condensing; said input and output switches being operable in the condensing mode of operation to connect said encoder means directly between said input and output terminals, said switches connecting said encoder means in series with said first and second inverters and said output and input terminals, respectively, when in the reproduction mode of operation, said encoder means together with said inverters reproducing the original signal sequence at said input terminal from the encoded condensed signal sequence applied to said output terminal; said encoder means comprising a plurality of encoder stages connected in series, said stages performing the same transformation function, at each of said encoder stages the encoding occurs in accordance with the rule 00→0; 1→11; 01→10.

* * * * *